United States Patent [19]

Boyce et al.

[11] Patent Number: 5,614,957
[45] Date of Patent: Mar. 25, 1997

[54] DIGITAL PICTURE-IN-PICTURE DECODER

[75] Inventors: Jill M. Boyce, Manalapan, N.J.; Larry Pearlstein, Newton, Pa.

[73] Assignee: Hitachi America, Ltd., Tarrytown, N.Y.

[21] Appl. No.: 464,912

[22] Filed: Jun. 5, 1995

Related U.S. Application Data

[63] Continuation of Ser. No. 339,436, Nov. 14, 1994, which is a continuation-in-part of Ser. No. 320,481, Oct. 11, 1994.

[51] Int. Cl.$^6$ .................................................. H04N 5/46
[52] U.S. Cl. ........................... 348/567; 348/390; 348/424; 348/568
[58] Field of Search .................................. 348/390, 424, 348/425, 567, 568; H04N 5/46

[56] References Cited

U.S. PATENT DOCUMENTS

| | | | |
|---|---|---|---|
| 4,238,773 | 12/1980 | Tsuboka et al. | 348/565 |
| 4,469,223 | 11/1995 | Kimura | 348/568 |
| 4,931,879 | 6/1990 | Koga et al. | 358/335 |
| 5,091,785 | 2/1992 | Canfield et al. | 348/567 |
| 5,237,460 | 8/1993 | Miller et al. | 360/8 |
| 5,313,303 | 5/1994 | Ersoz et al. | 348/439 |
| 5,335,117 | 8/1994 | Park et al. | 360/48 |
| 5,361,098 | 11/1994 | Lucas | 348/568 |
| 5,367,318 | 11/1994 | Beaudin et al. | 345/201 |
| 5,386,241 | 1/1995 | Park | 348/565 |
| 5,390,052 | 2/1995 | Kato et al. | 360/32 |
| 5,398,072 | 3/1995 | Auld | 348/426 |
| 5,408,270 | 4/1995 | Lim | 348/429 |
| 5,420,641 | 5/1995 | Tsuchida | 348/567 |
| 5,422,677 | 6/1995 | Do | 348/568 |
| 5,463,422 | 10/1995 | Simpson | 348/568 |
| 5,477,397 | 12/1995 | Naimpally et al. | 360/10.3 |

OTHER PUBLICATIONS

A. Hoffmann, B. Macq and J.J. Quisquater, "Future Prospects of the Cable TV Networks, New Technologies and New Services", Laboratoire de Telecommunications et Teledetection, pp. 13–22.

International Standards Organization – Moving Picture Experts Group, Draft of Recommendation H.262,ISO/IEC 13818-1 titled "Information Technology – Generic Coding of Moving Pictures and Associated Audio", Nov. 1993.

International Standards Organization – Moving Picture Experts Group, Draft of Recommendation H.262,ISO/IEC 13818-2 titled "Information Technology – Generic Coding of Moving Pictures and Associated Audio", Nov. 1993.

*Primary Examiner*—Howard W. Britton
*Attorney, Agent, or Firm*—Michaelson & Wallace; Michael P. Straub; Peter L. Michaelson

[57] ABSTRACT

Methods and apparatus for implementing a reduced cost HDTV/SDTV video decoder are disclosed. The described joint video decoder is capable of decoding HDTV pictures at approximately the resolution of standard definition television pictures and can be used to decode HDTV and/or SDTV pictures. The described video decoder may be used as part of a picture-in-picture decoder circuit for providing picture-in-picture capability without providing multiple full resolution video decoders. The reduction in decoder circuit complexity is achieved through the use of a plurality of data reduction techniques including the use of a preparser, downsampling, and truncating pixel values.

8 Claims, 6 Drawing Sheets

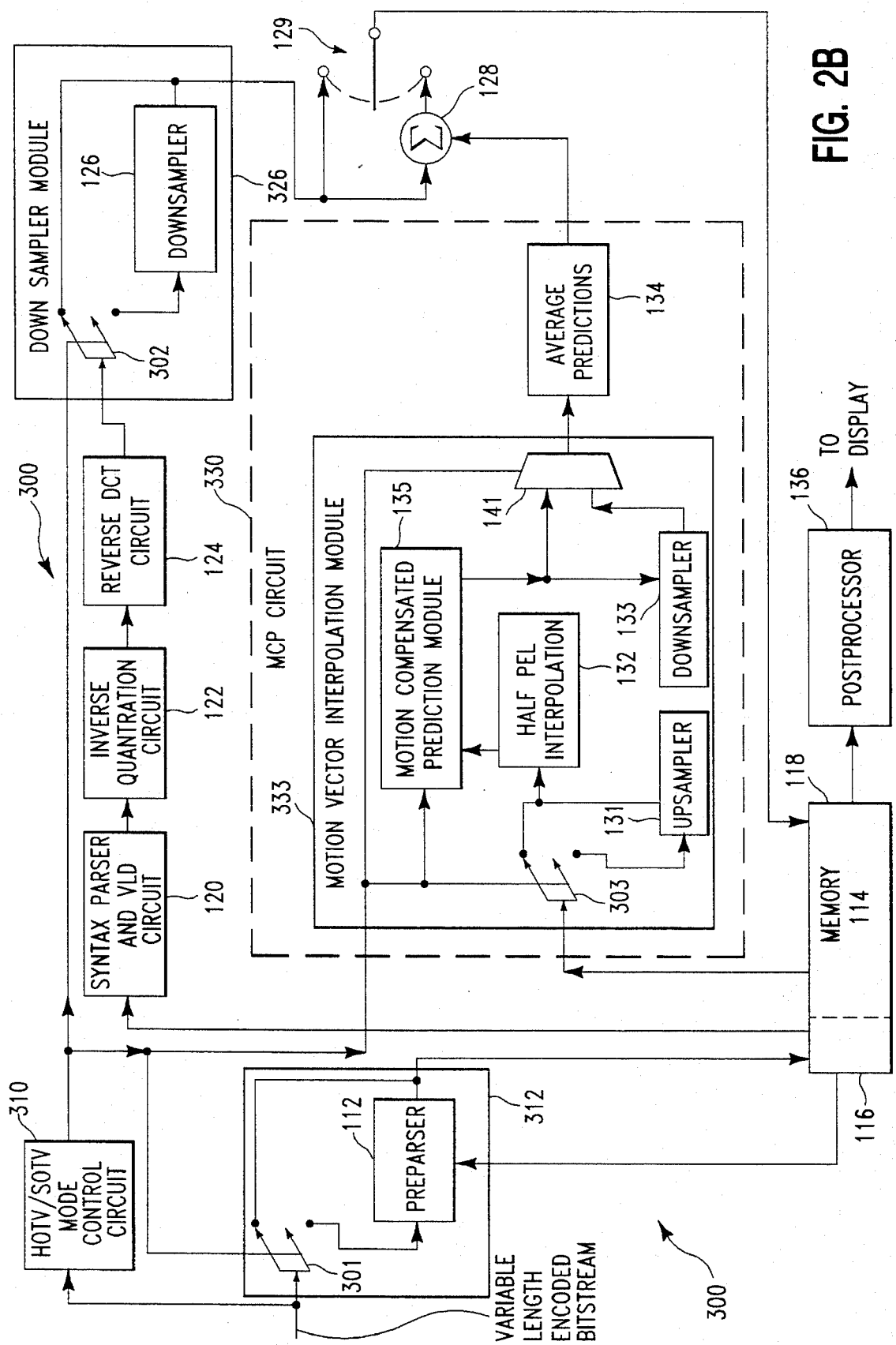

| X | X | X | 0 | 0 | 0 | 0 | 0 |
|---|---|---|---|---|---|---|---|
| X | X | X | 0 | 0 | 0 | 0 | 0 |
| X | X | X | 0 | 0 | 0 | 0 | 0 |
| X | X | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |

FIG. 3C

| X | X | X | 0 | 0 | 0 | 0 | 0 |
|---|---|---|---|---|---|---|---|
| X | X | X | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| 0 | 0 | 0 | 0 | 0 | 0 | 0 | 0 |
| X | X | 0 | 0 | 0 | 0 | 0 | 0 |
| X | X | X | 0 | 0 | 0 | 0 | 0 |

FIG. 3D

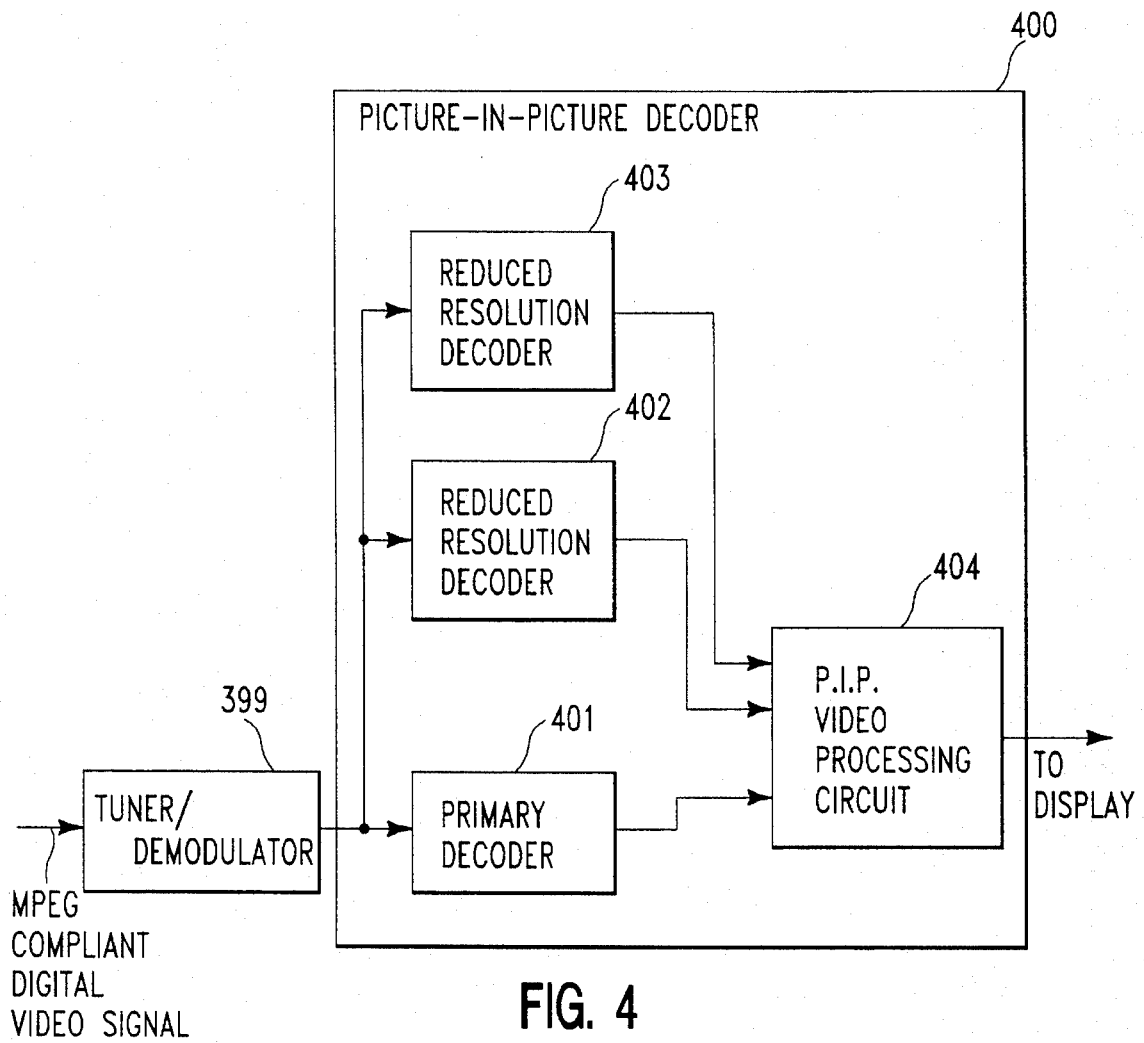

DIGITAL PICTURE-IN-PICTURE DECODER

RELATED APPLICATIONS

This patent application is a continuation of pending application Ser. No. 08/339,436, filed on Nov. 14, 1994, which is a continuation-in-part of pending U.S. patent application Ser. No. 08/320,481 filed on Oct. 11, 1994.

FIELD OF THE INVENTION

The present invention is directed to video decoders and, more particularly, to methods and apparatus for implementing video decoders that are capable of decoding high definition television ("HDTV") signals and/or standard definition television ("SDTV") signals.

BACKGROUND OF THE INVENTION

The use of digital, as opposed to analog signals, for television broadcasts and the transmission of other types of video and audio signals has been proposed as a way of allowing improved picture quality and more efficient use of spectral bandwidth over that currently possible using analog NTSC television signals.

The International Standards Organization has set a standard for video data compression for generating a compressed digital data stream that is expected to be used for digital television. This standard is referred to as the ISO MPEG (International Standards Organization —Moving Picture Experts Group) ("MPEG") standard. In accordance with the MPEG standard, video data is encoded using discrete cosine transform encoding and is arranged into variable length encoded data packets for transmission.

One version of the MPEG standard, MPEG-2, is described in the International Standards Organization—Moving Picture Experts Group, Drafts of Recommendation H.262, ISO/IEC 13818-1 and 13818-2 titled "Information Technology Generic Coding Of Moving Pictures and Associated Audio" (hereinafter "the November 1993 ISO-MPEG Committee draft") hereby expressly incorporated by reference. Any references made in this patent application to MPEG video data is to be understood to refer to video data that complies with MPEG-2 standards as defined in the November 1993 ISO-MPEG Committee drafts.

MPEG video data may be used to support either high definition television ("HDTV"), wherein the video frames are of higher resolution than those used in present NTSC signals, or what will be referred to as standard definition television ("SDTV"), e.g., television which has approximately the same resolution per frame as the existing analog NTSC standard. Because HDTV, which includes the proposed United States Advanced Television Standard ("US ATV"), provides higher resolution than SDTV, more data is required to represent a HDTV frame than is required to represent a SDTV frame. Accordingly, it is possible to transmit multiple SDTV signals in the same bandwidth required to support a single HDTV signal.

MPEG Main Profile at Main Level ("MP@ML") specifies various requirements for an MPEG compliant standard definition television signal and associated decoding equipment. MP@ML allows pictures as large as 720×576 pels for a total of 414,720 pels per picture. The proposed standard for US ATV allows for pictures as large as 1920×1080 pels for a total of 2,073,600 pels per picture.

Because of the relatively large amount of data required to represent each frame of a HDTV picture, HDTV decoders must support much higher data rates than SDTV decoders. The additional memory required by a HDTV decoder, as compared to a standard SDTV decoder, and the increased complexity associated with the inverse DCT circuit and other components of a HDTV decoder can make a HDTV decoder considerably more expensive than an SDTV decoder.

In fact, the cost of memory alone may make a HDTV set incorporating a HDTV decoder prohibitively expensive for some consumers. It is expected that a fully MPEG compliant video decoder for HDTV will require a minimum of 10 MB of RAM for frame storage with a practical HDTV decoder probably requiring about 16 MB of relatively expensive Synchronous DRAM.

Accordingly, there is a need for a method and apparatus that permits: (1) a simplification of the complexity of the circuitry required to implement a HDTV decoder, (2) a reduction in the amount of memory required to implement a HDTV decoder circuit, and (3) a single decoder that is capable of decoding both SDTV and HDTV signals. Furthermore, it is desirable that the cost of such a decoder be low enough that it is in a range that would be acceptable to most consumers, e.g., approximately the cost of a SDTV decoder.

While various proposals call for transmitting only US ATV signals it has also been suggested that some digital SDTV signals be broadcast. Various combinations of broadcasting HDTV and SDTV signals are possible with multiple SDTV shows being broadcast during a particular time of the day and a single HDTV broadcast being transmitted in the same bandwidth used for the SDTV signals at a different time of the day.

Thus, in order to remain compatible with both HDTV and SDTV broadcasts, there would be value in a television receiver include a video decoder capable of decoding both HDTV and SDTV signals and furthermore, that such a video decoder be capable of being implemented at a relatively low cost.

In addition, there is a need for a method and apparatus for implementing picture-in-picture capability in a digital television without incurring the cost of multiple full resolution decoders. In known analog picture-in-picture systems, during picture-in-picture operation, and full resolution decoder is normally used to decode the TV signal used to produce a main picture and a second full resolution decoder is used to decode the television signal which is used to provide the second picture displayed within a small area of the main picture.

SUMMARY OF THE PRESENT INVENTION

The present invention is directed to video decoders and, more particularly, to methods and apparatus for implementing video decoders that are capable of decoding high definition television ("HDTV") signals and/or standard definition compressed video signals.

In particular the present invention is directed to a plurality of methods and apparatus for reducing the complexity of digital video decoder circuitry and for reducing video decoder memory requirements. In accordance with the present invention, in order to reduce the cost associated with implementing a joint HD/SD television decoder, the decoder of the present invention is designed to optimize the amount of circuitry that is used during both HD and SD television decoder operation.

A HDTV decoder capable of decoding HDTV signals at less than full HDTV resolution, e.g., at approximately SDTV resolution and/or decoding SDTV signals is described. The decoder of the present invention can also be used to decode SDTV signals at full SD resolution. It is expected that as a result of the various data reduction features and circuit simplifications of the present invention a combined HDTV/SDTV decoder that outputs pictures at approximately SDTV resolution can be built at approximately 130% of the cost of a digital SDTV decoder.

In accordance with one embodiment of the present invention the described reduced resolution HDTV video decoders are used as part of a picture-in-picture decoder circuit for providing picture-in-picture capability without the use of multiple full resolution video decoders.

The decoder of the present invention achieves substantial reductions in circuit complexity and memory requirements through the use of a plurality of data reduction techniques including the use of a preparser, downsampling, and truncating bytes of data representing pixel values so that the pixel values are represented using only 5, 6 or 7 bits as opposed to, e.g., 8 bits per DCT value.

In accordance with one embodiment of the present invention, the preparser is used to discard data to permit a smaller channel buffer than would otherwise be required to be used. In addition, the preparser discards run-length/amplitude symbols for each macroblock, e.g., the run-length/amplitude symbols for each luminance or chrominance block of a macroblock, when the number of run-length/amplitude symbols exceeds a maximum preselected number per macroblock and/or block. In one embodiment the preparser also limits the number of bits output per unit time period, e.g., by limiting the number of bits per macroblock, such that a predetermined data processing rate which is determined by the combined capability of the coded data buffer and syntax parser and variable length decoder circuit is not exceeded. In this manner, the present invention permits a simpler real-time syntax parser and variable length decoder circuit to be used than would be possible without such preparsing.

In accordance with the present invention, an inverse quantizer circuit and an inverse discrete cosine transform circuit are designed to process only a preselected set of DCT coefficients corresponding to each macroblock and to set the rest of the coefficients, e.g., the DCT coefficients removed by the preparser, to zero. In this manner the computational requirements of the inverse quantizer circuit and inverse discrete cosine transform circuit are substantially reduced allowing for simpler circuit implementation.

In addition to the use of the preparser, the use of a downsampler and/or a least significant bit truncation circuit provide for further reductions in the amount of data used to represent each video picture thereby resulting in a significant reduction in frame buffer memory requirements.

In order to compensate for the effect of data reduction, including downsampling and data elimination, the decoder of the present invention may include low pass filters.

The above described features and embodiments of the present invention along with numerous other features and embodiments are described below.

BRIEF DESCRIPTION OF THE DRAWINGS

FIG. 2B illustrates a video decoder circuit capable of decoding both HDTV and SDTV video signals in accordance with the present invention.

FIGS. 3A through 3E illustrate 8×8 blocks of DCT coefficients corresponding to a HDTV macroblock in accordance with different embodiments of the present invention.

FIG. 4 illustrates an exemplary circuit for decoding video images to support picture-in-picture television operation in accordance with the present invention.

DETAILED DESCRIPTION

Figure 1:
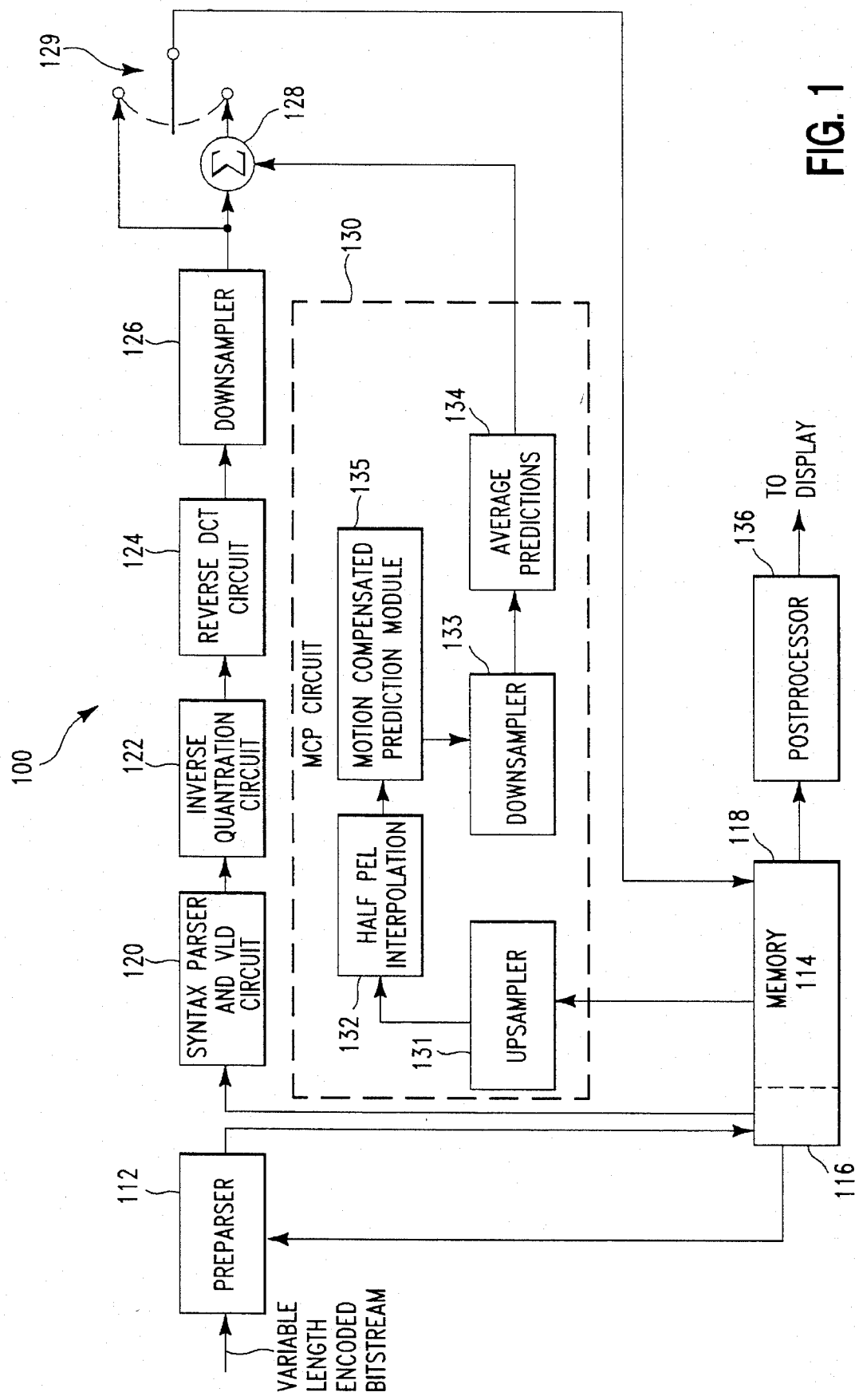
FIG. 1 illustrates a video decoder in accordance with one exemplary embodiment of the present invention.

The present invention is directed to video decoders and, more particularly, to a low cost video decoder that is capable of decoding high definition and/or standard definition digital video signals. In accordance with the present invention decoded HD pictures will be displayed with less than full HD resolution, e.g., at approximately SD resolution, while SD pictures will be displayed at full SD resolution. The decoder of the present invention can be implemented as a low cost HDTV decoder or as a joint HD/SD television decoder. While the detailed description of the present invention is directed primarily to exemplary embodiments of HDTV, SDTV and combined HDTV/SDTV decoders, it is to be understood that the numerous features of the present invention may be used to provide low cost reduced resolution digital video decoders suitable for decoding digital pictures in general, and that this disclosure is therefore not limited solely to SDTV and HDTV decoders. Furthermore, while the exemplary embodiments are described as MPEG compatible decoders it should be noted that the decoders of the present invention can be implemented to decode a plurality of MPEG like video data streams that use discrete cosine transform data encoding.

In the case of television sets with relatively small screens, e.g., less than 20 inch screens, the difference in perceived resolution and picture quality between a HDTV signal and an SDTV signal will be barely noticeable. Accordingly, low cost HDTV decoders in accordance with the present invention which provide less than full HDTV picture resolution and quality are particularly well suited for such applications because of their cost advantages. The decoder of the present invention is also well suited for providing picture-in-picture capability because of the small display area of the second picture being displayed and the relatively low cost of the decoder of the present invention as compared to the cost of a full HDTV decoder.

The method of the present invention for decoding HD and SD pictures includes the steps of reducing the resolution of received HD pictures prior to decoding by using, e.g., a preparser unit and/or adaptive field/frame downsampling to reduce the complexity of later processing stages of the decoder. In addition, by using an inverse discrete cosine transform ("IDCT") circuit designed to maximize the amount of common circuitry used for processing both reduced resolution HD and SD pictures the cost of implementing a combined HD/SD decoder circuit is reduced Referring now to FIG. 2, there is illustrated a video decoder generally indicated by the reference numeral 100, implemented in accordance with one embodiment of the present invention. The illustrated decoder 100 is capable of decoding HD and/or SD television signals, e.g., MPEG compliant television signals. When used as a HD decoder, the decoder circuit 100 can produce images from a HDTV signal that are comparable in quality or slightly better than SD television images.

The SD/HD video decoder circuit 100 comprises a preparser 112, a syntax parser and variable length decoder circuit 120, an inverse quantizer 122, an inverse DCT circuit 124, a down sampler 126, a summer 128, a switch 129, a post processor 136, a motion compensated prediction ("MCP") circuit 130, and a memory circuit 114 including a coded data buffer and a frame buffer 118.

Methods of reducing the overall cost of a HDTV decoder will now be described with reference to the embodiment of FIG. 1.

Generally, the single most expensive element of a video decoder, in terms of cost, is the frame memory 118 which may comprise, e.g., 16 MB of synchronous DRAM in a HD decoder. The coded data buffer 116, which is used for the temporary storage of the compressed bitstream represents a smaller but not insignificant cost. A fully MPEG compliant HDTV decoder is expected to require at least 1 MB of RAM for use as a coded data buffer.

Other elements of a decoder which add significantly to the cost of the decoder are the inverse discrete cosine transform circuit ("IDCT") 124 and the inverse quantizer ("IQ") circuit 122. The IDCT circuit 124 of a HDTV decoder is required to perform a large number of arithmetic computations at a high rate and therefore is likely to represent a significant portion of a decoder's circuitry. The IQ circuit 122 performs a smaller number of computations than the IDCT circuit 124 but because of the high speed and complexity of the computations, the cost of the IQ circuit 122 may also be a significant component of a HDTV decoder's overall cost.

In addition to the IDCT circuit 124 and the IQ circuit 122 motion compensation and interpolation logic may require a significant amount of logic gates, e.g., the motion compensation and interpolation logic may require more logic gates than the IQ circuit to implement but less than the IDCT circuit. The syntax parser and variable length decoder circuit 120 may also require a significant amount of logic gates to implement.

Because the cost and complexity of a HDTV decoder is largely a function of the requirement that it process large amounts of data on a real time basis, it is possible to reduce the complexity and thus the cost of a HDTV compatible decoder by reducing the amount of data that needs to be processed. While using only a small portion of the video data received in an HDTV signal will result in reduced resolution and picture quality, by carefully selecting which HDTV data to process and the method by which it is processed, video image quality comparable to or better than SD television signals can be achieved. As will be discussed below, the preparser 112 serves to dynamically limit the amount of video data supplied to the remaining elements of the decoder circuit 100 including the syntax parser and VLD circuit 120 thereby reducing the amount of data that must be processed by the subsequent circuit elements on a real time basis and the required complexity of those circuit elements. An additional benefit of the use of the preparser 112 is that it permits for the use of a smaller coded data buffer 116 than would otherwise be required.

As illustrated in FIG. 2, the preparser 112 has a first input for receiving the variable length encoded bitstream representing, e.g., a HDTV signal output by a transport demultiplexer/decoder circuit of a receiver, and a second input for receiving data rate control information. The output of the preparser 112 is coupled to the input of the coded data buffer 116 which has a rate control output coupled to the second input of the preparser 112.

The preparser 112 operates to reduce the amount of HDTV data supplied to the coded data buffer. It does this by selectively discarding some of the received HDTV data. By using the preparser 112 to parse and discard data prior to variable length decoding it is possible to operate the preparser 112 at a data rate that is a function of the data rate of the received bitstream. This rate will be considerably lower than the data rate that the corresponding circuitry would have to be capable of supporting if it were located after the variable length decoder circuit 120. By preparsing the data prior to storing in the coded data buffer 116 and syntax parsing and variable length decoding, the need to support the worst case processing requirements that might otherwise be encountered by the SP and VLD circuit 120 is avoided. Since the maximum data rate, e.g., the worst case data rate, that the SP and VLD circuit 120 would normally have to be designed to support can be as much as 60 times higher than the average data rate, a substantial reduction in the complexity of the SP and VLD circuit 120 can be achieved by using the preparser 112 to insure that support for what would normally be the worst case variable length decoding scenario need not be provided.

The preparser 112 parses the incoming bitstream, without performing a complete variable length decode operation, to identify data corresponding to different types of video frames, such as bi-directionally coded ("B-") frames, predictively coded video frames ("P-") frames and intra-coded ("I-")frames, and to identify MPEG coding elements such as macroblocks including motion vectors and DCT coefficients associated with each of the identified frames in the received data stream.

The preparser 112 performs several data reduction operations on a HDTV bitstream as required to insure that the processing capacity of the SP and VLD circuit 120 and throughout capability of the coded data buffer 116 are not exceeded. Thus, the preparser 112 operates to insure is that the preparser output data rate stays within a real time decoding envelope established by the decoding limits of the other components of the decoder 100. By reducing the data rate as required, the preparser 112 also serves to reduce the coded data buffer size requirements because the coded data buffer 116 need only be capable of storing a reduced amount of data.

In one embodiment, to insure that the preparser output data rate stays within the preselected limits of the decoding envelope, the preparser 112 limits the number of DCT coefficients used to represent a macroblock and/or a block of a macroblock to a preselected number and also limits the number of bits per macroblock and/or block of a macroblock by removing the highest order DCT coefficients associated with a received macroblock and/or block until the desired number of bits per macroblock and/or block required to prevent the coded data buffer capacity and decoding limits from being exceeded is achieved. Both the number of DCT coefficients per macroblock and the number of bits per macroblock and/or block can be preselected to approximately achieve the desired data rate or can be dynamically selected by the preparser 112. Thus, it is possible to insure that the output data rate of the preparser stays within the decoding envelope by operating directly on macroblocks as a whole or on the individual blocks which comprise the macroblock where each macroblock includes one or more luminance and chrominance blocks.

Thus, in one embodiment, to limit its output data rate to a level required to prevent the coded data buffer 116 from overflowing, the preparser 112 limits the number of DCT coefficients which are used to represent each macroblock and/or block of a macroblock by discarding the higher frequency DCT coefficients which exceed a preselected number of DCT coefficients. In such an embodiment, removal of AC DCT coefficients may be performed preferentially on B- frames, then P- frees and then I- frames, with a preference for retaining data in earlier P- frames as opposed to later P- frames as measured from the most recently received I- frame, as required to achieve the desired reduction in the preparser output data rate.

In DCT based video compression systems the DCT coefficients are naturally ordered in two dimensions according to vertical and horizontal frequency bins. In typical systems the coefficients are assigned a one-dimensional ordering to allow for sequential transmission. MPEG allows for two different orderings, generally called zig-zag scan and alternate scan.

It may be the case that the subset of DCT coefficients which are preserved, i.e., the DC DCT coefficients and lower frequency AC DCT coefficients not discarded by the preparser 112 may not be consistent with any linear range of coefficients in either of the MPEG scanning types. In such a case, it is difficult to limit the DCT coefficients to the desired set by discarding all of the coded coefficients of a macroblock or block after a certain point in the data stream.

In accordance with the present invention, two different approaches are used to insure that the preparser 112 discards the preselected DCT coefficients. In accordance with a first embodiment, the preparser 112 chooses the coefficient index in scan order after which to discard coefficients. In this embodiment the retained set of DCT coefficients will initially include all coefficients which do belong to the desired set as well as some coefficients which do not belong to the desired set. The preparser 112 then sends the DCT coefficients which include those that belong to the desired set to the coded data buffer 116 to be passed to the SP and VLD circuit 120.

In a second embodiment, the preparser 112 recodes the incoming bitstream. This is done by removing run length/amplitude codes which refer to undesired coefficients, and by then recoding the later desired coefficients with suitably modified run lengths.

By limiting the number of DCT coefficients per macroblock and/or block, the preparser 112 effectively discards runlength/amplitude symbols which effectively cause zero DCT coefficient values thus allowing for a simpler IDCT circuit 124 to be used, in some embodiments, as opposed to the IDCT circuit that would be required to fully decode a HDTV bitstream.

The discarding of run-length/amplitude symbols also allows for a simpler syntax parser and variable length decoder circuit 120 than would other wise be required because the use of the preparser 112 insures that no more than the preselected number of run-length/amplitude pairs per macroblock and/or block will be output by the preparser 112 for further processing.

Yet another benefit of the discarding of some DCT coefficients, i.e., the effective setting of such coefficients to zero, is that the preparser 112 effects lowpass filtering on a macroblock basis thereby reducing or eliminating the need for additional filtering before a downsampling operation, which will be described below, is performed.

In one particular embodiment, the preparser 112 also operates to detect and eliminate data from the received bitstream which will have no impact on ultimate picture quality. In one such embodiment, the preparser 112 deletes from the data stream such MPEG data as bit slice stuffing and start code zero stuffing to thereby reduce the data rate without impacting picture quality. By eliminating such unnecessary data, the preparser output data rate and the size of the coded data buffer 116 can be reduced in this manner with no impact on picture quality.

In one embodiment of the present invention, the preparser 112 dynamically adjusts the amount of data discarding performed as a function of the amount of memory available in the coded data buffer 116 for storing the received data. In order to facilitate such dynamic data discarding the coded data buffer 116 includes a data rate monitoring circuit which generates a signal supplied to the second input of the preparser 112 indicating how much data is stored at any given time in the coded data buffer 116.

In such an embodiment, the preparser 112 maintains a model of coded data buffer 116 occupancy and works to ensure that the buffer 116 will never overflow. As buffer occupancy increases as indicated by the signal received from the buffer 116, the preparser 112 becomes more severe in the amount of high frequency information that is discarded further reducing the number of DCT coefficients per macroblock or block from a preselected maximum number to a lower number.

The preparser 112 can look to buffer occupancy characteristics of the received bitstream, e.g., the manner in which the video data was originally encoded for data transmission, and use this information as a factor in determining what information should be discarded to achieve the required reduction in the data rate.

As one feature of the dynamic control of its output data rate and thus buffer control, the preparser 112 computes and stores the number of bits used to code each row of macroblocks that comprise a picture as the data is received. While this number may vary dramatically from row to row and picture to picture, since the decoder will take roughly the same amount of time to process each row of macroblocks regardless of the number of bits used to represent the row of macroblocks, the preparser can predict the rate of code buffer emptying. When this rate is expected to be relatively fast, e.g., because a large number of bits are used to represent the preceding rows of macroblocks, the preparser 112 can discard less data from the received data stream without concern of the coded data buffer 116 overflowing. However, when relatively few bits are used to code the macroblocks representing the preceding rows of macroblocks, the coded data buffer 116 will empty on a comparatively slow basis requiring the preparser 112 to discard more data from the received data stream until the coded data buffer 116 becomes less occupied.

In one embodiment, to minimize implementation costs, the preparser 112, which may also be referred to as a bitstream preprocessor, is designed to run at the incoming bit rate and is implemented using a bit serial architecture. Alternatively, the preparser 112 can parse an entire token at once, and at a rate that never needs to exceed the data rate of the received variable length encoded bitstream divided by the minimum length of a symbol in the bitstream.

As will be discussed below, when the decoder circuit 100 is used as a joint reduced cost HDTV decoder and SDTV decoder, the data throughput is selected to permit the passing of a full rate SDTV bitstream.

The coded data buffer 116, which is coupled to the preparser 112, in the above described manner, is used to temporarily store the variable length encoded data output by the preparser 112 until the syntax parser and variable length decoding circuit 120 is ready to accept the video data for processing.

The syntax parser and variable length decoder circuit 120 has an input coupled to a data output of the coded data buffer 116 to receive therefrom the variable length encoded data temporarily stored therein. The syntax parser and variable length decoder ("SP and VLD") circuit 120 decodes the received data to a constant length bit stream.

By using the preparser 112 in the above described manner, the computation requirements of the SP and VLD circuit 120 are substantially reduced as compared to the case where all the received data is syntax parsed and variable length decoded. The preparser 112 effectively limits the number of DCT coefficients which must be variable length decoded for any given macroblock and/or block by discarding coefficients exceeding the preselected maximum number permitted per macroblock or the preselected maximum number per block thus reducing the burden on the real time SP and VLD circuit 120 by putting a clear limit on the amount of data that will have to be processed for each macroblock.

The output of the SP and VLD circuit 120 is coupled to the input of the inverse quantization ("IQ") circuit 122 which, in turn, has an output coupled to the input of the IDCT circuit 124.

Reduced complexity IQ and IDCT circuits 122 and 124 are implemented in accordance with the present invention by intentionally setting preselected AC DCT coefficients corresponding to each macroblock to zero. The IQ circuit 122 can be designed to preform this function.

The IQ circuit 122 receives the data output by the SP and VLD circuit 120 and operates to generate DCT values of zero for preselected DCT coefficients regardless of the input value of the preselected DCT coefficients. In this manner, the IQ circuit need not actually process the preselected DCT coefficients received at its input but only the remaining DCT coefficients.

In one exemplary embodiment, the IQ circuit 122 sets all but the upper left 4×4 region of DCT coefficients of a set of 8×8 DCT coefficients representing a HDTV block to zero. FIG. 3A illustrates the resulting effect on an 8×8 block of DCT coefficients. In the illustration of FIG. 3, Xs are used to represent DCT values that are actually processed by the IQ circuit 122, while as illustrated all the other DCT values are set to zero.

Accordingly, in such an embodiment, the IQ circuit 122 need only include circuity for performing inverse quantization on 16 of the possible 64 DCT coefficients corresponding to each block and circuitry for outputting zeros for the remaining DCT coefficient values. In this manner, the inverse quantization computation requirement is reduced by a factor of four. The complexity of the IDCT circuit 124 is reduced in a similar manner since a preselected number of the DCT values will be set to zero by the IQ circuit 122.

MPEG permits the use of either interlaced pictures or non-interlaced pictures. When encoding video data as interlaced pictures, the DCT operation may have been performed on either a field or frame DCT basis. When interlaced video data is encoded on a frame DCT basis the high frequency coefficients represent temporal as well as spatial information. In such a case it may be desirable to maintain high vertical frequencies to maximize the preservation of temporal information.

Accordingly, in one exemplary embodiment in which it is expected that some interlaced pictures encoded on a frame DCT basis will be received, the IQ circuit 120 is designed to force to zero all DCT coefficients except the DCT coefficients corresponding to rows 0, 1, 6 and 7 and columns 0, 1, 2, 3 of an 8×8 block of DCT coefficients representing a two dimensional array of DCT coefficients corresponding to a HDTV macroblock. Such a case is illustrated in FIG. 3B where Xs are used to represent DCT coefficient values that are processed by the IQ circuit 122 and zeros are used to represent the preselected DCT coefficients that are set of zero.

It should be noted that it is possible to select DCT coefficients other than those illustrated in the embodiments of FIGS. 3A and 3B to be set to zero depending on the desired implementation.

The IDCT circuit 124 receives the data output by the inverse quantization circuit 122 and performs an inverse DCT operation on the received data. Because, in accordance with the present invention, preselected DCT coefficients were intentionally set to zero, the inverse DCT circuit need not include circuitry for processing those coefficients. Thus, as with the inverse quantization circuit 122, the IDCT circuit 124 can be implemented using a relatively simple circuit.

The output of the IDCT circuit 124 is coupled to the input of the downsampler 126. The downsampler 126 is used to downsample the data corresponding to each picture prior to storage in the frame buffer 118. As a result of the downsampling operation, the amount of data required to represent a video frame is substantially reduced. For example if the downsampler 126 is implemented to remove half of the digital samples used to represent a picture, the amount of data that would have to be stored will be reduced by a factor of approximately two substantially reducing the amount of memory required to implement the frame buffer 118.

Figure 2A:
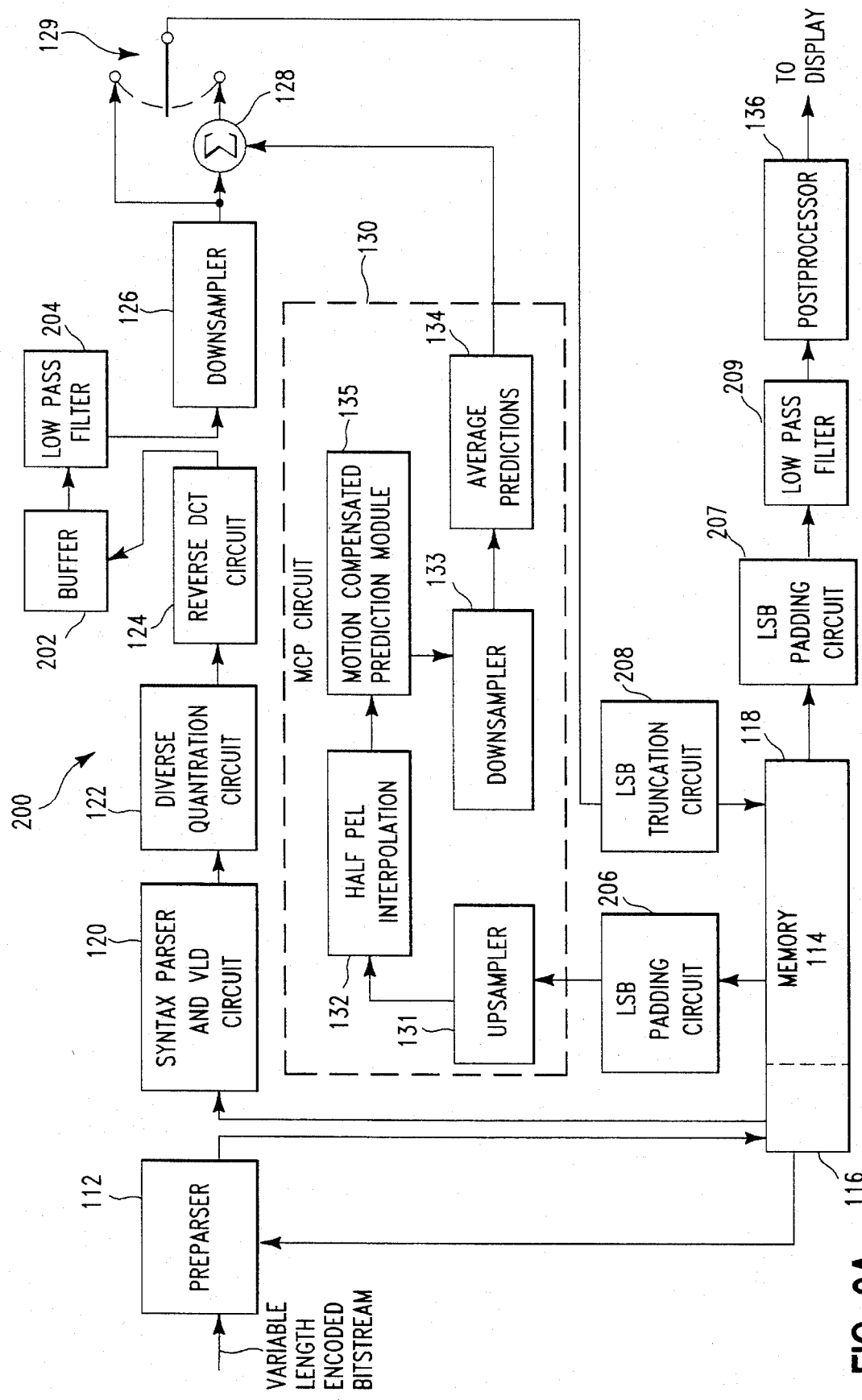
FIG. 2A illustrates a video decoder in accordance with a second exemplary embodiment of the present invention.

Referring now briefly to FIG. 2A there is illustrated another embodiment of the decoder according to the present invention as indicated by the reference numeral 200. Like numbered elements in FIGS. 1 and 2A are the same or similar to each other and thus will not be described again in detail. In the decoder 200, a small buffer 202, e.g., a buffer capable of storing the data corresponding to several lines of a video frame, in combination with a low pass filter 204, is used to couple the output of the IDCT circuit 124 to the input of the downsampler 126. The buffer 202 stores video data representing several scan lines of a picture which is then low pass filtered by the low pass filter 204 prior to downsampling to reduce the blockiness in the image that might otherwise result from the downsampling operation.

Referring again to FIG. 1 it can be seen that the output of the downsampler 126 is coupled to a first input of the summer 128 and a first input of the switch 129. A second input of the summer 128 is coupled to the output of the MCP circuit 130 which supplies motion compensation information to the summer 128 to be combined with received P- and B- video frames. The video data output by the summer 128 represents a video frame that has been processed using motion compensation data to include the relevant video information from preceding and/or subsequent anchor frames. The output of the downsampler 126, on the other hand, represents either fully decoded picture data or decoded prediction residuals in the cases of intraframe coded macroblocks and non-interframe coded macroblocks respectively. The switch 129 is controlled, as is known in the art, to selectively couple the output of the downsampler 126 to the input of the frame buffer 118 when the received video macroblock was not encoded using motion compensated prediction, e.g., when the video data output by the downsampler was intra-frame coded. However, when the video data output by the downsampler 126 was encoded using motion compensated prediction, e.g., when it is B- frame or P- frame data, the output of the summer 128 is coupled by the switch 129 to the input of the frame memory 118.

The received downsampled, decompressed video frames are stored in the frame memory 118. The frame memory 118 has a first output coupled to an input of the MCP circuit 130 and a second output coupled to an input of the post processor circuit 136. In this manner the MCP circuit is supplied with downsampled video frames to be used as anchor frames for motion compensation purposes.

Referring again briefly to FIG. 2A, it can be seen that the decoder 200 contains additional circuitry for reducing the amount of data required to be stored by the frame buffer 118, i.e., a least significant bit ("LSB") truncation circuit 208. The LSB circuit 208 couples the output of the switch 129 to the input of the frame buffer 118. MPEG assumes that 8 bits will be used per pel when representing a video frame. In accordance with the present invention, in order to reduce frame buffer memory requirements, one or more least significant bits are truncated from each set of bits representing a pel. For example, in one embodiment, the LSB truncation circuit 208 truncates the data representing a pel from 8 bits to e.g., 6 or 7 bits. When the data corresponding to each pel is truncated to 6 bits a data savings of approximately 25% results.

The amount of truncation performed may be implemented as a function of the type of frame to which the data corresponds. Because reduction in the resolution in anchor frames will impact the quality of frames which use these frames for motion compensation purposes, it may be desirable to reduce the resolution of these frames less than frames, such as B- frames, which do not impact the quality of other frames. Accordingly, in one embodiment anchor frame data, e.g., I- and P- video frame data, is truncated to 7 bits per pel while data which is not used for anchor frames, e.g., B- frame data, is truncated to 5 bits per pel.

When LSB truncation is used to reduce frame buffer memory requirements, in order to maintain MPEG compatibility it is necessary to represent the stored data in an 8 bit per pel format. Accordingly, the outputs of the frame buffer 118 are coupled to least significant bit padding circuits 206, 207 which pad the least significant bits of the data output by the frame buffer 118 with zeros to insure that the data corresponding to each pel of a frame is represented by 8 bits. The output of the LSB padding circuit 206 is coupled to the input of the MCP circuit thereby providing the MCP circuit with downsampled video frame data. The output of the LSB padding circuit 207 is coupled to the input of an optional low pass filter 209 which, in turn, is coupled to the post processing circuit 136. The optional low pass filter 209 reduces the effect of the quantization noise generated as a result of the truncation and padding process but also results in a slight reduction in the resolution of the video frame being supplied to the post processing circuit 136.

The operation of the MCP circuit 130 illustrated in FIGS. 1 and 2A, which is designed to operate using motion vectors generated in accordance with the MPEG standard, will now be described.

MPEG supports the use of motion compensation and, in particular, P- frames and B- frames each of which rely on another frame as an anchor frame. The motion vectors received as part of the video data stream supplied to the preparser 112 were calculated at encoding time for use with full resolution video frames as opposed to downsampled video frames.

In accordance with the present invention, the downsampled frames supplied by the frame buffer 118 to the MCP circuit 130 are upsampled, e.g., on-the-fly, interpolated and then downsampled prior to generating predictions based on the motion vectors. In this manner the motion vectors which were originally generated based on full resolution video frames are effectively applied to downsampled video frames.

As illustrated in FIG. 1, the MCP circuit 130 comprises an upsampler 131 which has an input coupled to the first output of the frame buffer 118, and an output coupled to the input of a half pel interpolation circuit 132. The output of the half pel interpolation circuit 132 is coupled to the input of a motion compensated prediction module 135. The output of the motion compensated prediction module 135 is coupled to a downsampler 133 which, in turn, has an output coupled to the input of the average predictions circuit 134. The output of the average predictions circuit 134, which serves as the output of the MCP circuit 130, is coupled to the second input of the summer 128.

Various known upsampling and down sampling filters may be used for the upsampler 131 and downsampler 133, respectively. However, for best results, simulations have shown that it is very important that the downsampler 133 use a downsampling process which is the exact inverse of the upsampling process since even small differences are made noticeable in inter-coded video frames after many generations of predictions.

There are several ways the required upsampling and downsampling can be accomplished. For example, in one embodiment a bilinear upsampling filter with a 3×3 kernel and a center coefficient=1.0 is used as the upsampler 131 and a downsampler which does not perform filtering is used as the downsampler 133. This selection of filters allows for reasonably good upsampling with no additional blurring during downsampling. This filter arrangement works especially well when the residual image to be accumulated during predication has been lowpass filtered prior to accumulations. Such low pass filtering is, as discussed above, achieved to some extent as a result of the preparser 112 removing higher order AC DCT coefficients from macroblocks which include more than the preselected maximum number of DCT coefficients per macroblock or by removing higher order AC DCT coefficients from blocks of a macroblock which include more than a preselected maximum number of DCT coefficients per block.

In another embodiment an upsampling filter with a kernel size of 2×2 pixels is used as the upsampler 131 and a downsampling filter is used with the same kernel size as the upsampling filter and a transfer function such that the convolution of the upsampling filter transfer function and the downsampling filter transfer function produces a 3×3 kernel whose center coefficient is 1.0.

While it is preferred that identical downsampling circuits be used for the downsampler 126, 123 there is no requirement that this in fact be the case. However, it is important that the downsampler 133 be matched to the upsampler 131, as discussed above, to provide good results.

MPEG permits the portion of an image corresponding to a macroblock to be encoded either on an interlaced or noninterlaced manner. Macroblocks corresponding to noninterlaced pictures are always coded using a frame DCT format and with macroblocks corresponding to interlaced pictures being coded using either a field or frame DCT format.

In accordance with the present invention, downsampling is performed separately on each individual macroblock. Downsampling of macroblocks corresponding to noninterlaced pictures is performed by the downsampler 126 on a frame basis.

However, with regard to macroblocks corresponding to interlaced pictures downsampling can be performed on either a field or frame basis for each macroblock.

As discussed above, the downsampler 126 performs downsampling on non-interlaced pictures on a frame basis. However, with regard to interlaced pictures it can be performed on either a field or frame basis. Thus, in the case of macroblocks of interlaced pictures one is confronted with a decision whether the downsampling, performed by the downsamplers 126, 133, should be done on a field or on a frame basis. Field based downsampling preserves the greatest degree of temporal resolution whereas frame based downsampling has the potential of preserving the greatest degree of spatial resolution. In one embodiment of the present invention pictures are downsampled in a consistent manner either on a field or frame basis when interlaced pictures are received. Accordingly, in one embodiment both interlaced and noninterlaced pictures are downsampled on a frame basis. While in another embodiment non-interlaced pictures are downsampled on a frame basis while interlaced pictures are downsampled on a field basis.

In another slightly more elaborate embodiment, the downsampler 126 performs downsampling on a interlaced pictures on both a field and frame basis with the particular method depending on the individual macroblock being processed.

Field based downsampling is most appropriate when there is not much high frequency content in the macroblock being downsampled and/or there is a great deal of motion associated with the macroblock. On the other hand, frame based downsampling is most appropriate when there is significant high frequency content in the macroblock being processed and/or little motion associated with the macroblock. Accordingly, in one embodiment, the downsampler 126 assesses the described characteristics for each macroblock of an interlaced picture and dynamically determines the most appropriate method for downsampling the individual macroblock.

In yet another embodiment which supports downsampling on both a field and frame basis but which requires relatively little circuitry for deciding which down sampling approach to use, the downsampler 126 merely follows the choice made by the encoder when it originally encoded the macroblock being downsampled since the criteria used for previously deciding whether to encode the macroblock on a field or frame DCT basis is similar to the criteria which should be used to decide whether to downsample on a field or frame basis.

Accordingly, in one embodiment of the present invention the downsampler 126 downsamples macroblocks corresponding to an interlaced picture on a frame basis if they were encoded on a frame DCT basis and downsamples them on a field basis if they were encoded on a field DCT basis.

While the downsampling of frames prior to storage in the frame buffer 114 reduces frame buffer memory requirements, it has the disadvantage of requiring the use of the upsampler 131, half pel interpolation circuit 132 and downsampler 133 in order to take full advantage of the motion vectors. Such circuitry slightly increases the processing requirements as compared to those of standard MCP circuits 15 since the anchor picture data must be upsampled prior to interpolation if half-pel resolution is to be achieved. It should be noted that as an alternative to upsampling, interpolation, and then downsampling, a less complicated and thus less costly way to perform motion compensation, with somewhat lower quality results, is to divide the value of each original motion vector by the integer decease in resolution and take the average integer result of the division operation as the new motion vector value.

While downsampling thus tends to increase MCP processing requirements slightly it has the advantage of reducing the complexity of the input/output circuitry to the MCP circuit because the data bandwidth into and out of the MCP circuit 130 is reduced as a result of the downsampling by the same factor as the buffer frame memory requirements.

In accordance with one embodiment of the present invention, in order to reduce the processing and bandwidth requirements of the MCP circuit 130, and thus the complexity of the MCP circuit 130, bi-directional and dual-prime prediction is avoided. Thus eliminating the need for the average predictions circuit on the ability to process to anchor frames simultaneously. Once a picture has been upsampled by the upsampler 131 interpolation is preformed by the half pel interpolation circuit. The motion compensated prediction module then actually applies the motion vectors to the upsampled picture which is then downsampled by the downsampler 133. When the picture being processed is a bi-directionally coded picture, the upsampling interpolation, motion and prediction operations will be performing on two anchor frames which are then averaged together by the average predictions circuit to generate the single picture output by the MCP circuit 135.

This is accomplished, in accordance with one embodiment of the present invention by using only a single reference or anchor picture for prediction purposes even if the macroblock type flag associated with a macroblock being processed indicates that it is a bi-directional coded macroblock, i.e., a macroblock that was coded based on the content of two different pictures.

In such an embodiment when the bi-directionally coded macroblocks are received, the MCP circuit 130 performs motion compensation using only one reference despite the fact that the macroblock type flag associated with the individual macroblock being processed in the data stream indicates that motion compensation should be performed using two references.

In an exemplary embodiment, the upsampler circuit 131 detects when a bi-directionally or dual coded macroblock is being processed, selects which of the two possible anchor pictures associated with the macroblock to use for predication purposes and then upsamples only the selected anchor picture.

In one embodiment, the upsampler circuit 131 selects which of the two possible anchor pictures to use for predication purposes by selecting the anchor picture that is temporally closet to the current picture and thus macroblock being processed. If the two anchor pictures are temporally equidistant, the average predictions circuit 134 selects the earlier of the two possible anchor pictures to thereby select the one of the two anchor pictures which will have suffered the least degradation due to drift.

Since errors do not propagate from B-pictures, because they are not used as anchors for subsequent pictures, a fairly large degree of distortion, i.e., of the type caused by using only a single anchor picture for prediction purposes, can be tolerated with regard to B-pictures. However, the use of a single anchor picture for prediction purposes with dual-prime coded sequences may result in somewhat less satisfactory results because prediction errors may propagate when dual-prime coded sequences are used.

Referring now to FIG. 2B there is illustrated a video decoder circuit 300 according to the present invention capable of decoding HDTV signals at less than full HDTV resolution and SDTV signals at full SD resolution. As illustrated, the decoder circuit 300 is similar to the decoder circuit 100 but includes additional circuitry, i.e., a HDTV/SDTV mode control circuit 310 for controlling the decoder circuit's mode of operation, a set of switches 301, 302, 303 and a multiplexer 341 for bypassing the decoder's preparser 112, downsampler 126, upsampler 131, and downsampler 133 when the HDTV/SDTV mode control circuit 310 determines what an SDTV signal is being received. When the HDTV/SDTV mode control circuit 310 determines that a HDTV signal is being received it controls switches 301, 302, 303 and multiplexer 341 to connect the circuit elements in generally the same manner as illustrated in the embodiment of FIG. 1 so that the data reduction features of the decoder circuit 300 of FIG. 2B are operative.

The HDTV/SDTV mode control circuit 310 receives as its input the variable length encoded bitstream. From analyzing the data in the bitstream, e.g., header information indicating the resolution of the video frames being received, it determines if it is receiving HDTV data, i.e., data of a higher resolution than it can decode without performing data reduction operations on the received data, or SDTV data, i.e. data which the decoder 300 can fully decode and store without having to perform any data reduction operations.

The HDTV/SDTV mode control circuit 310 generates a mode control signal which is supplied to a position control input of the switch 301 which is part of the preparser module 312, a position control input of the switch 302 which is part of a downsampler module 326 and a position control input of the switch 303 and multiplexer 341 which is part of a motion vector interpolation module 333. As discussed above, the output signal of the HDTV/SDTV mode control circuit 310 operates to switch each of the modules 312, 326, and 333 between a first mode of operation, e.g., a SDTV mode of operation, to a second mode of operation, e.g., a HDTV mode of operation. In such a manner, the decoder 300 is controlled by the HDTV/SDTV mode control circuit to perform data reduction to reduce the resolution of the received frames during the second mode, i.e., the HDTV mode of operation, but not during the first mode of operation, i.e. the SDTV mode of operation.

While the frame buffer 118, coded channel buffer 116, IQ circuit 122, IDCT circuit 124, MCP circuit 330 and SP and VLD circuit 120 are generally the same in the decoder 300 as the decoder 100, various features of each of these decoder elements will be discussed as they relate to the particular embodiment illustrated in FIG. 2B, e.g., when they are implemented as part of a decoder which is capable of decoding both a television signal of a first resolution and a second television which is of lower resolution than the first television signal, e.g., HD and SD television signals.

The preparser 112, in the embodiment illustrated in FIG. 2B, is designed to reduce the data rate of a received HDTV signal to approximately that of a SDTV signal. Thus, the preparser 112 limits the number of runlength/amplitude symbols per coded macroblock and the number of bits per macroblock so that the SP and VLD circuit 120 can function at approximately the same rate when processing HDTV signals as when processing SDTV signals, e.g., at the MP@ML specified maximum data rate.

This reduces the memory requirements for the coded data buffer 116 which serves as a channel buffer. Thus, the decoder 300 uses a channel buffer that meets the memory requirements for a SDTV decoder but which is smaller than that required for a fully MPEG compliant HDTV decoder.

U.S. ATV specifies a channel buffer of 8 Mb, whereas only 1.5 Mb are required to implement a MP@ML channel buffer. Because the MP@ML specification requires 830 Kbits more for a frame buffer than are required for decoding reduced resolution video pictures in accordance with one embodiment of the present invention, this 830 Kbits of the frame buffer which are not used for picture storage during HDTV mode operation can be used to supplement the memory of the channel buffer when operating in HDTV mode. Thus, in accordance with the present invention, the coded data buffer is implemented using approximately 2.33 Mbits which are also required to implement a full resolution SD decoder.

It is the responsibility of the preparser 112 to insure that the coded channel buffer 116 does not overflow during HDTV mode operation. This is achieved by, e.g., the preparser 112 discarding the less useful DCT coefficients in order to prevent the smaller than full size HDTV channel buffer 116 from overflowing.

While, the SP and VLD unit 120 is designed to operate at the same general data rate as a SDTV data rate, it is also designed to accommodate the larger range of parameter values allowable for HDTV coding, as compared to SDTV decoding, e.g., frame rate, picture horizontal size and picture vertical size. Thus, the SP and VLD circuit 120, because of the larger range of parameter values required to support both HDTV and SDTV decoding, is slightly more complicated then a standard SDTV syntax parser and variable length decoder circuit in this regard.

As described above, the output of the syntax parser 120 is coupled to the input of the IQ circuit 122 which, in turn, is coupled to the IDCT circuit 124. The IQ and IDCT circuits 122, 124 of the decoder 300 will now be described.

MPEG MP@ML allows for pixel rates of up to 10.4 million pixels per second. U.S. ATV allows for pixel rates of up to 62.2 million pixels per second.

In accordance with the present invention, IQ circuitry which meets MP@ML IQ requirements is used for the IQ circuit 122 of the decoder 300. In such an embodiment, the IQ circuit 122 is designed to process all the DCT coefficients of a SDTV macroblock but only, a subset of DCT coefficients of a HDTV macroblock, e.g., 10 or 11 DCT coefficients of each HDTV block including, e.g., a total of 64 DCT coefficients.

That is, the IQ circuit 122 is designed to set a preselected group of DCT coefficients of a HDTV macroblock to 0 while processing the remaining DCT coefficients of each HDTV macroblock being processed. In one exemplary embodiment, for HDTV macroblocks coded using field DCTs, the DCT coefficients of an 8×8 block are discarded by the IQ circuit 122 as illustrated in FIG. 3C where zeros are used to represent discarded DCT coefficients and X's are used to represent DCT coefficients which are processed by the IQ circuit 122. For HDTV blocks coded using frame DCTs, the DCT coefficients of an 8×8 block are discarded by the IQ circuit 122 as illustrated in FIG. 3D.

The IDCT circuit 124, like the IQ circuit 122 is designed to processes only a small percentage of the DCT coefficients associated with a HDTV block, e.g., the same DCT coefficients processed by the IQ circuit 122.

An IDCT engine capable of performing fast one dimensional 8 point IDCTs can be used to implement the 2-D IDCT operation required by the IDCT circuit 124. A standard MP@ML IDCT engine can be used to compute about three 8 point IDCTs in the time allowed for IDCT processing of one HDTV block. Accordingly, in one embodiment of the present invention, only DCTs in the first three columns of an HDTV block are processed by the IDCT circuit 124, e.g., the DCT coefficients indicated by Xs in FIGS. 3C and 3D.

Accordingly, in one embodiment the IDCT circuit 124 includes a MP@ML compliant IDCT engine for calculating IDCTs of the first three columns of a HDTV block and all the IDCTs of a SDTV block. Since, in accordance with the exemplary embodiment of the present invention, the DCT coefficients of all but the first three columns of a 8×8 HDTV block are set to zero, there is no need to calculate the IDCTs for any coefficients outside the first three columns.

While the MP@ML IDCT engine is used to calculate the column IDCTs, an IDCT engine for calculating the row IDCTs for a HDTV block is also included in the IDCT circuit 124. However, in accordance with the present invention, this can be a relatively simple IDCT engine since 5 of the 8 row coefficients will always be zero by the preselected setting of such coefficients to zero. Furthermore, because only the first two or three columns contain coefficient values that are to be used in the calculation of row DCTS only 2 or 3 points need to be calculated for each row transform. Note that in the embodiment which uses the 8×8 DCT arrangement illustrated in FIGS. 3C and 3D only 4 rows have to be transformed when no additional filtering is performed prior to downsampling by the downsampler 126.

As an alternative method of implementing an IDCT circuit 124 which uses an MP@ML IDCT engine as part of HD decoder IDCT circuit, the low frequency rectangle of coefficients from several blocks may be combined into a single block as illustrated in FIG. 3E, where "1" is used to represent low-frequency coefficients from a first block, "2" is used to represent low-frequency coefficients from a second blocks, "3" is used to represent low-frequency coefficients from a third block and "4" is used to represent low frequency DCT coefficients from a fourth block.

In accordance with this alternative embodiment, the IDCT circuit 124 arranges the DCT coefficients from four different HDTV blocks into a single 8×8 block of DCT coefficients in the described manner and a conventional 8×8 point IDCT engine is then used to process the composite block of DCT coefficients. After processing by the 8×8 point IDCT engine relatively simple linear operations performed on the result of the IDCT operation are used to generate a good approximation of the IDCTs of the low frequency coefficients of each one of the four component HDTV blocks used to form the composite coefficient block.

As discussed above, the video picture data output of the IDCT circuit 124 is downsampled when the decoder 300 is operating in HDTV mode prior to storing in the frame buffer 118 to thereby further reduce memory requirements.

MP@ML allows for pictures as large as 720×576 pels for a total of 414720 pels per picture while US ATV allows for pictures as large as 1920×1080 pels per picture. Sequences received in the 1920×1080 pel picture format can be downsampled by a factor of 3 horizontally and a factor of 2 vertically to yield a maximum resolution of 640×540 pels for a total of 345,600 pels. In such an embodiment, the same amount of memory required to implement a full resolution SD decoder is satisfactory for storing a downsampled HDTV video picture. Thus, the memory provided for MP@ML would be adequate for the reduced resolution HD decoder as well, with an additional 830 KBits available for other purposes, e.g., for use as part of the coded data buffer 116 when operating in HDTV mode as described above.

By selecting decoder components that are designed in the above manner, it is possible to implement a combined low resolution HDTV decoder and full resolution SD decoder at a cost that is expected to be about 130% of the cost of a full resolution SDTV decoder. The decoder 300 may be used as part of a television set which is designed to decode and display both HDTV and SDTV signals at a relatively low cost as compared to a system incorporating a full resolution HDTV decoder.

The decoders illustrated in any of FIGS. 1 and 2A–2B may also be used to implement picture-in-picture capability in a HDTV or SDTV set without incurring the cost of having to provide a full resolution decoder for the decoder used to display the picture shown inside the main picture of a picture-in-picture display.

For a MPEG compatible digital television set to operate in a picture-in-picture mode, two MPEG decoders must be used, a first decoder to decode the full resolution picture to be displayed on a first portion of the screen and a second decoder to decode the reduced size picture displayed on a second smaller portion of the screen.

Referring now to FIG. 4, there is illustrated a picture-in-picture ("PIP") decoder 400 in accordance with the present invention. The PIP decoder 400 receives MPEG compliant demodulated digital video information, e.g., either an SD or HD TV signal, from a tuner/demodulator 399 which is supplied to the input of a primary, e.g., full resolution decoder 401 and to the input of one or more reduced resolution decoders, i.e., the first and second reduced resolution decoders 402, 403.

The primary decoder 401 is responsible for decoding the main picture of a picture-in-picture image while the first and second decoders are responsible for generating separate images which will be displayed in a small area of the main picture. A separate reduced resolution decoder 402 or 403 is used for each additional image that is to be displayed in addition to the main picture.

The output of the primary decoder 401 and the reduced resolution decoders 402, 403 is coupled to the input of a picture-in-picture video processing circuit which operates to combine the main picture with the reduced resolution pictures output by the reduced resolution decoders 402, 403 prior to the resulting combined picture being displayed.

In one embodiment of the present invention the size of the reduced resolution pictures incorporated into the main picture is selected to be ¼×¼ the size of the normal picture. In such an embodiment, each MPEG 8×8 pixel block need only be decoded to a size corresponding to a block of 2×2 pixels.

The cost of the IDCT circuit 124 used in the reduced resolution decoders 402, 403 can be substantially reduced in accordance with the present invention by performing the IDCT operations on only 2×2 blocks as opposed to 8×8 blocks. This is achieved by, e.g., retaining and processing only the upper left 2×2 block of DCT coefficients of each 8×8 DCT coefficient block of a HDTV picture with all the other DCT coefficients being set to zero. Accordingly, in such an embodiment, the IDCT circuit cost is reduced to approximately the cost of a circuit which can perform a 2×2 IDCT as opposed to an 8×8 IDCT.

The IQ circuit 122 of the reduced resolution decoders 402, 403 can be simplified in a similar manner with the IQ circuit 122 operating only on a 2×2 block of DCT coefficients, i.e., 4 coefficient values, as opposed to 64 DCT coefficient values that form an 8×8 DCT coefficient block.

In accordance with the present invention, the reduced resolution decoders 402, 403 store the low resolution frames in their reduced size. Thus, by using 2×2 DCT coefficient blocks the size of the frame buffers can be about 1/16th of the size that would be required if 8×8 DCT coefficient blocks, i.e., full resolution blocks, were stored.

In addition to reducing frame buffer size the preparser 112 serves to reduce channel buffer requirements and the complexity of the SP and VLD circuit by, in accordance with the PIP embodiment, discarding amplitude/runlength pairs corresponding to each block that exceed the 4 amplitude/runlength pairs that are used by the reduced resolution PIP decoder 402 or 403.

In a PIP embodiment, the MCP circuit 130 can perform interpolation on the reference frames for macroblocks whose motion vectors are not evenly divisible by four to achieve good prediction results. For a less expensive and somewhat lower quality implementation, motion vectors could be rounded to the nearest factor of 4 and applied without interpolation.

While the above PIP decoder embodiment of the present invention has been described in the context of using ¼×¼ size pictures for the secondary pictures inserted into the primary picture, other size pictures could also be generated at reduced cost, e.g., ½×½ size pictures, using the decoder 100 described above. In such a case, the downsampling would have no be performed in a manner that would produce the desired reduction in size and data rate.

It should also be noted that the arrangement illustrated in FIG. 4 can be used to provide picture-in-picture capability in a SDTV receiver as well as a HDTV receiver. Furthermore, the illustrated PIP decoder arrangement is in no way limited to a specific degree of resolution with regard to the primary decoder 401 and only requires that the secondary decoder(s) 402, 403 be implemented as reduced resolution decoders as compared to the resolution supported by the primary decoder.

What is claimed is:

1. A method of decoding a digital video signal including a picture of one of a first and a second degree of resolution, the first degree of resolution being a higher degree of resolution than the second degree of resolution, the picture including digital video data, the method comprising the steps of:

providing a picture buffer for storing pictures;

receiving the digital video signal including the picture;

monitoring the digital video signal to determine whether the received picture is of the first or second degree of resolution;

upon determining that the received picture is of the first degree of resolution performing the steps of:
   i. downsampling the picture to reduce the amount of video data included in the picture; and
   ii. storing the picture in the picture buffer;

upon determining that the received picture is of the second degree of resolution performing the step of storing the picture in the picture buffer without downsampling.

2. A digital picture-in-picture decoder circuit for decoding a primary picture to be displayed in a primary picture area and a second picture to be displayed in a secondary picture area, the secondary picture area being smaller than the primary picture area, the decoder circuit comprising:

a full resolution video decoder for receiving and decoding a first set of digital video data including the primary picture;

a first reduced resolution video decoder for receiving a second set of digital video data including the second picture and for decoding the received video data to generate a reduced resolution version of the second picture;

a second reduced resolution video decoder for receiving a third set of digital video data including a third picture and for decoding a reduced resolution version of the third picture; and a post processor circuit coupled to the full resolution video decoder and the first and second reduced resolution video decoders, the post processor circuit operating to combine the reduced resolution version of the first full resolution picture, the reduced resolution version of the second picture and the reduced resolution version of the third picture to form the single picture.

3. A digital video decoder circuit for decoding a primary picture represented by a first set of digital video data and a second picture represented by a second set of digital video data, the second set of digital video data including a plurality of macroblocks, each macroblock including a plurality of DCT coefficients, the decoder circuit comprising:

a full resolution video decoder for receiving and decoding the first set of digital video data;

a reduced resolution video decoder for receiving and decoding the second set of digital video data to generate a reduced resolution version of the second picture, the reduced resolution video decoder including:
   i. preparser means for receiving the second set of digital video data and for removing from each macroblock DCT coefficients that exceed a preselected maximum number of DCT coefficients per macroblock; and
   ii. a channel buffer coupled to the preparser means for temporarily storing the video data output by the preparser means; and a post processor circuit coupled to the full resolution decoder circuit and the reduced resolution decoder circuit, the post processor circuit operating to combine the primary full resolution picture and the reduced resolution version of the second picture into a single picture.

4. The digital video decoder circuit of claim 3, wherein the channel buffer is a size which is smaller than the size required to store the entire second set of digital video data.

5. The digital video decoder circuit of claim 4, wherein the reduced resolution video decoder further comprises:

a syntax parser and variable length decoder circuit coupled to the channel buffer for variable length decoding the second set of digital video data;

a downsampler coupled to the syntax parser and variable length decoder circuit for downsampling the variable length decoded video data to thereby reduce the amount of resolution of the second picture and the amount of video data used to represent the second picture.

6. The digital video decoder circuit of claim 5, wherein the full resolution video decoder is a HDTV decoder and wherein the reduced resolution video decoder is a reduced resolution video decoder that generates pictures ¼×¼ the size of the full resolution video decoder.

7. A digital video decoder circuit for decoding a primary picture represented by a first set of digital video data and a second picture represented by a second set of digital video data, the decoder circuit comprising:

a full resolution video decoder for receiving and decoding the first set of digital video data;

a first reduced resolution video decoder for receiving and decoding the second set of digital video data to generate a reduced resolution version of the second picture, the first reduced resolution video decoder including:
   i. a data reduction circuit for eliminating a portion of the data included in the second set of digital video data; and
   ii. a channel buffer coupled to the data reduction circuit for temporarily storing the video data output by the data reduction circuit, the channel buffer being a size which is smaller than the size required to store the entire second set of digital video data; and a post processor circuit coupled to the full resolution decoder circuit and the first reduced resolution decoder circuit, the post processor circuit operating to combine the primary full resolution picture and the reduced resolution version of the second picture into a single picture.

8. The video decoder circuit of claim 7, further comprising:

a second reduced resolution video decoder coupled to the postprocessing circuit for receiving and decoding a third set of digital video data to generate a reduced resolution version of a third picture; and wherein the post processor circuit operates to combine the reduced resolution version of the third picture with the primary full resolution picture and the reduced resolution version of the second picture to form the single picture.

* * * * *

UNITED STATES PATENT AND TRADEMARK OFFICE
CERTIFICATE OF CORRECTION

PATENT NO : 5,614,957
DATED      : March 25, 1997
INVENTOR(S): Jill M. BOYCE, Larry A. PEARLSTEIN It is certified that error appears in the above-identified patent and that said Letters Patent is hereby corrected as shown below:

In column 19, lines 31-51 delete claim 1.

In the drawings, Sheets 1 and 3, in Figures 1 and 2B in block 122 replace "QUANTRATION" with --QUANTIZATION--.

In the drawings, Sheets 1, 2, and 3, in Figures 1, 2A and 2B in block 124 replace "reverse" with --INVERSE--.

In the drawings, Sheet 2, in Figure 2A in block 122 replace "DIVERSE QUANTRATION" with --INVERSE QUANTIZATION--.

In the drawings, Sheet 3, in Figure 2B in block 310 replace "HOTV/SOTV" with --HDTV/SDTV--.

Signed and Sealed this

Fifteenth Day of May, 2001

*Attest:*

NICHOLAS P. GODICI

*Attesting Officer*      *Acting Director of the United States Patent and Trademark Office*